United States Patent [19]

Kawabe et al.

[11] Patent Number: 4,863,828

[45] Date of Patent: Sep. 5, 1989

[54] POSITIVE-WORKING O-QUINONE DIAZIDE PHOTORESIST COMPOSITION

[75] Inventors: Yasumasa Kawabe; Kazuya Uenishi; Tadayoshi Kokubo, all of Shizuoka, Japan

[73] Assignee: Fuji Photo Film Co., Ltd., Kanagawa, Japan

[21] Appl. No.: 145,862

[22] Filed: Jan. 20, 1988

[30] Foreign Application Priority Data

Jan. 20, 1987 [JP] Japan .................................. 62-10180

[51] Int. Cl.$^4$ .......................... G03C 1/60; G03C 1/54
[52] U.S. Cl. .................................. 430/191; 430/192; 430/193; 534/557
[58] Field of Search ....................... 430/191, 192, 193; 534/557

[56] References Cited

U.S. PATENT DOCUMENTS

| | | | |
|---|---|---|---|
| 3,046,118 | 7/1962 | Schmidt | 430/192 |
| 3,102,809 | 9/1963 | Endermann et al. | 430/193 |
| 3,106,465 | 10/1963 | Neugebaucu et al. | 430/193 |
| 3,130,047 | 4/1964 | Uhlig et al. | 430/193 |
| 4,421,841 | 12/1983 | Shimizu et al. | 430/285 |
| 4,424,270 | 1/1984 | Erdmann et al. | 430/193 |
| 4,499,171 | 2/1985 | Hosaka et al. | 430/193 |
| 4,550,069 | 10/1985 | Pampalone | 430/191 |
| 4,594,306 | 6/1986 | Stahlhofen et al. | 430/191 |
| 4,626,492 | 12/1986 | Eilbeck | 430/191 |

FOREIGN PATENT DOCUMENTS

| | | | |
|---|---|---|---|
| 148787 | 7/1985 | European Pat. Off. | 430/193 |
| 211667 | 2/1987 | European Pat. Off. | 430/191 |

OTHER PUBLICATIONS

English Translation of Japanese Publication No. 60–121,445, Published 12/6/1983, (Hosaka et al.).

*Primary Examiner*—Charles L. Bowers, Jr.
*Attorney, Agent, or Firm*—Sughrue, Mion, Zinn, Macpeak & Seas

[57] ABSTRACT

A positive-working photoresist composition is disclosed, which comprises a light-sensitive substance of 1,2-naphthoquinonediazide-4- and/or -5-sulfonate of 2,3,4,3′,4′,5′-hexahydroxybenzophenone and an alkali-soluble novolak resin dissolved in ethyl lactate or methyl lactate.

7 Claims, No Drawings

POSITIVE-WORKING O-QUINONE DIAZIDE PHOTORESIST COMPOSITION

FIELD OF THE INVENTION

This invention relates to a positive-working photoresist composition capable of responding to radiation and, particularly, to a photoresist composition which has high resolving power, high speed, and which is suited for forming a pattern of fine structure cross section.

BACKGROUND OF THE INVENTION

The positive-working photoresist composition of the present invention comprises an improvement in the composition disclosed in U.S. patent application Ser. No. 07/125,278, filed Nov. 26, 1987, the disclosure of which is herein incorporated by reference.

Positive-working photoresist compositions generally comprise a composition containing an alkali soluble resin and a light-sensitive substance of naphthoquinonediazide compound. For example, U.S. Pat. Nos. 3,666,473, 4,115,128, 4,173,470, etc., describe "novolak type phenolic resin/substituted naphthoquinonediazide compound", and L. F. Thompson, Introduction to Microlithography (ACS, No. 219, pp. 112-121) describes an example of a "novolak resin composed of cresolformaldehyde/1,1-naphthoquinonediazidesulfonate of trihydroxybenzophenone" as the most typical composition.

Novolak resins used as binders are particularly useful for this use, since they can be dissolved in an alkaline aqueous solution without swelling and, when a resulting image is used as a mask for an etching process, they provide a high resistance particularly against plasma etching. Naphthoquinonediazide compounds, which themselves function as a dissolution-preventing agent to reduce alkali solubility of the novolak resin, are peculiar in that, when decomposed by irradiation with light, they produce an alkali-soluble substance which increases the alkali solubility of the novolak resin. Naphthoquinonediazide compounds are particularly useful as light-sensitive substances for a positive-working photoresist due to the above-described great change in properties to be caused by light.

Many positive-working photoresists containing a novolak resin and a naphthoquinonediazide light-sensitive substance have so far been developed and put into practice from the above-described point of view, and sufficient results have been obtained in working with a line width of about 1.5 μm to 2 μm.

However, the degree of integration of IC circuits has been increasing more and more and, in the manufacture of semiconductor bases for super-LSI, etc., working of superfine pattern composed of line with a width of up to 1 μm has been required In such uses, photoresists having high resolving power, high pattern-reproducing accuracy capable of accurately reproducing an exposure mask image, and high speed in view of high productivity have been required However, the above described conventional positive-working photoresists fail to meet these requirements.

SUMMARY OF THE INVENTION

Therefore, an object of the present invention is to provide, particularly in manufacture of semiconductor devices:

(1) a positive-working photoresist composition having high resolving power;

(2) a positive-working photoresist composition capable of accurately reproducing mask dimensions over a wide range of photomask line width;

(3) a positive-working photoresist composition capable of forming a resist pattern of line width of up to 1 μm with a cross section of a high aspect ratio;

(4) a positive-working photoresist composition capable of forming a pattern having a cross section with almost a vertical side wall;

(5) a positive-working photoresist composition having a broad development latitude;

(6) a positive-working photoresist composition having excellent storage stability which does not generate deleterious substances after a long-time storage; and (7) a positive-working photoresist composition capable of providing a resist image having excellent heat resistance.

The present invention provides a positive-working photoresist composition which comprises, as a light-sensitive substance, 1,2-naphthoquinonediazide-4-and-/or -5-sulfonate of 2,3,4,3',4',5'-hexahydroxybenzophenone and an alkali-soluble novolak resin dissolved in ethyl lactate or methyl lactate.

DETAILED DESCRIPTION OF THE INVENTION 1,2-Naphthoquinonediazide-4- and/or -5sulfonates of 2,3,4,3',4',5'-hexahydroxybenzophenone are ester compounds having the structure represented by the following general formula (A):

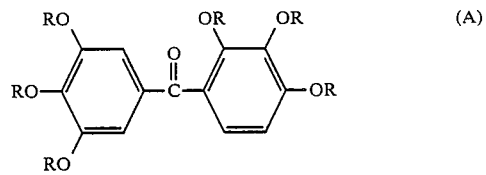

wherein the R's may be the same or different and each represents a hydrogen atom, a 1,2-naphthoquinonediazide-4-sulfonyl group or a 1,2-naphthoquinonediazide-5sulfonyl group.

The ester compounds used as light-sensitive substances in the present invention have an esterification ratio of suitably not less than 40%, preferably not less than 55%, from the standpoint of resolving power, cross section profile, etc. Too low an esterification degree spoils the resist properties such as resolving power and cross sectional profile of the resist.

Of the ester compounds used in the present invention, 1,2-naphthoquinonediazide-5-sulfonates of 2,3,4,3',4',5'-hexahydroxybenzophenone are preferable.

The above-described esters used in the present invention can be easily synthesized by condensing 2,3,4,3',4',5'-hexahydroxybenzophenone represented by the following formula (B):

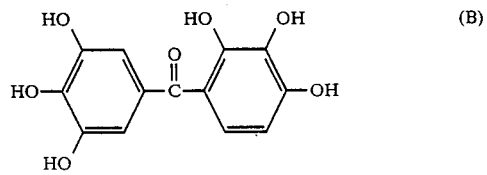

with 1,2-naphthoquinonediazide-5-sulfonyl chloride or 1,2-naphthoquinonediazide-4-sulfonyl chloride or a mixture thereof, which is a known compound.

2,3,4,3',4',5'-hexahydroxybenzophenone used here and represented by the formula (B) can be synthesized according to the process of H. Bleuler et al. (*J. Chem. Soc.*, 107 (1916)).

The esterification reaction between the compound of the formula (B) and 1,2-naphthoquinonediazide-5-sulfonyl chloride or 1,2-naphthoquinonediazide-4sulfonyl chloride is conducted in a conventional manner. That is, predetermined amounts of hexahydroxybenzophenone represented by the formula (B) and 1,2-naphthoquinonediazide-5-sulfonyl chloride or 1,2-naphthoquinonediazide-4-sulfonyl chloride, and a solvent such as dioxane, acetone or methyl ethyl ketone are placed in a flask, and a basic catalyst such as sodium hydroxide, sodium carbonate, sodium hydrogencarbonate, triethylamine or the like is dropwise added thereto to conduct the condensation reaction. The thus-obtained product is washed with water, purified, and dried. The light-sensitive substances represented by the general formula (A) can be prepared in the above-described manner.

In the above esterification reaction, a mixture of compounds of formula (A) wherein each of the compounds has different numbers of esterified group and different esterification positions can be obtained. Thus, the term "esterification ratio" as used herein means an average esterification ratio of the mixture of the esterified compounds.

The esterification ratio can be controlled by varying a mixing ratio of the starting compound of formula (B) and 1,2-naphthoquinonediazido-4- and/or -5-sulfonyl chloride. That is, since substantially the total amount of 1,2-naphthoquinonediazido-4- and/or -5-sulfonyl chloride added takes part in the esterification reaction, an esterified mixture having the desired esterification ratio can be obtained by appropriately adjusting the molar ratio of the starting compound of formula (B) and 1,2-naphthoquinonediazido-4- and/or -5-sulfonyl chloride. For example, when an esterified mixture of compounds represented by formula (A) having an esterification ratio of 66.7% is desired, 4 mols of 1,2-naphthoquinonediazido-4- and/or -5-sulfonyl chloride can be used per mol of the starting compound of formula (B).

The esterification ratio of the resulting compound can be determined by a conventional method such as the NMR method.

The alkali-soluble novolak resin used in the present invention can be obtained by addition condensation of a phenol with 0.6 to 1.0 mol of an aldehyde per mol of the phenol in the presence of an acid catalyst. As the phenol, phenol, o-cresol, m-cresol, p-cresol, xylenol, etc., may be used alone or as a combination of two or more. As the aldehyde, formaldehyde, paraformaldehyde, furfural, etc., are used and, as the acid catalyst, hydrochloric acid, sulfuric acid, formic acid, oxalic acid, acetic acid, etc., may be used. The thus-obtained novolak resin having a molecular weight of 1,000 to 50,000 is alkali soluble.

A suitable ratio of the light-sensitive substance to the alkali-soluble novolak resin used in the present invention comprises 5 to 100 parts by weight, preferably 10 to 50 parts by weight, of the light-sensitive substance per 100 parts by weight of the novolak resin. If the amount of the light-sensitive substance is less than 5 parts by weight, a seriously reduced film-remaining ratio results whereas, if more than 100 parts by weight, a reduction in speed and solubility in solvents results.

Although the above-described light-sensitive substances are mainly used in the present invention, conventional light-sensitive substances such as esters between 2,3,4-trihydroxybenzophenone, 2,4,4'-trihydroxybenzophenone, 2,4,6-trihydroxybenzophenone or the like and 1,2-naphthoquinonediazide-4- and/or -5-sulfonyl chloride may also be used, if desired. In such cases, they may be used in amounts of not more than 100 parts by weight, preferably not more than 30 parts by weight, per 100 parts by weight of the above-described light-sensitive substance (A).

The composition of the present invention may further contain a polyhydroxy compound for accelerating dissolution of the composition into a developer. Preferred examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensate resin, etc. The polyhydroxy compound can be used in a proportion of from about 0.01 to about 20wt %, preferably from 0.2 to 5wt %, based on the total weight of the solid contents of the composition.

The most preferable results (with respect to long-time storage stability, resolving power, and resist cross sectional profile) are obtained when ethyl lactate or methyl lactate is used alone or in combination as a solvent for dissolving the light-sensitive substance of the present invention and the alkali-soluble novolak resin. If desired, however, one or more organic solvents conventionally used may be mixed with the above-described solvent in an amount of up to 50wt %, preferably up to 30wt %, of the solvent component. Suitable solvents used in combination with ethyl or methyl lactate are ketones (e.g., methyl ethyl ketone, cyclohexanone, etc.), alcohol ethers (e.g., ethylene glycol monomethyl ether, ethylene glycol monoethyl ether, etc.), ethers (e.g., dioxane, ethylene glycol dimethyl ether, etc.), cellulose esters (e.g., methyl Cellosolve acetate, ethyl Cellosolve acetate, etc.), fatty acid esters (e.g., butyl acetate, etc.), halogenated hydrocarbons (e.g., 1,1,2-trichloroethylene, etc.), and highly polar solvents (e.g., dimethylacetamide, N-methylpyrrolidone, dimethylformamide, dimethyl sulfoxide, etc.).

The positive-working photoresist composition of the present invention may contain, if desired, dyes, plasticizers, adhesion aids, surfactants, etc. Specific examples thereof include dyes such as Methyl Violet, crystal Violet, Malachite Green, etc., plasticizers such as stearic acid, acetal resin, phenoxy resin, alkyd resins, etc., adhesion aids such as hexamethyldisilazane, chloromethylsilane, etc., and surfactants such as nonylphenoxypoly(ethyleneoxy)ethanol, octylphenoxypoly(ethyleneoxy)ethanol, etc.

The positive-working photoresist composition of this invention has a solid content of from about 10 to about 50% by weight, preferably from 20 to 40% by weight, and more preferably 25 to 35% by weight, based on the total weight of the composition.

The above-described positive-working photoresist composition is coated on a base (e.g., silicon/ silicon oxide coat) to be used for the manufacture of accurate IC elements using an appropriate coating means such as a spinner or a coater, exposed through a predetermined mask, then developed to obtain a good resist.

More specifically, the positive-working photoresist composition of the present invention can be coated in a thickness of 0.5 to 3 μm on a semiconductor wafer or a support of glass, ceramic, metal or the like using a spin-coating process or a roller-coating process. Then, the coated composition is dried by heating, exposed to ultraviolet rays or the like through an exposure mask to print thereon a circuit pattern or the like, then developed to obtain a positive image. A subsequent etching process using this positive image as a mask enables pattern-wise work on the underlying support to be conducted. Typical fields for the photoresist composition include processes for manufacturing semiconductors such as IC circuits, processes for manufacturing circuit supports for liquid crystals, thermal heads, etc., and other photofabrication processes.

Suitable developers for the positive-working photoresist composition of the present invention are aqueous solutions of alkalis such as inorganic alkalis (e.g., sodium hydroxide, potassium hydroxide, sodium carbonate, sodium silicate, sodium metasilicate, aqueous ammonia, etc.), primary amines (e.g., ethylamine, n-propylamine, etc.), secondary amines (e.g., diethylamine, di-n-butylamine, etc.), tertiary amines (e.g., triethylamine, methyldiethylamine, etc.), quaternary ammonium salts (e.g., tetramethylammonium hydroxide, as described in *IBM Technical Disclosure Bulletin*, Vol. 13, No. 7, p. 2009, 1970, tetraethylammonium hydroxide as described in U.S. Pat. No. 4,239,661, etc.), alcoholamines (e.g., dimethylethanolamine, triethanolamine, etc.), or cyclic amines (e.g., pyrrole, piperidine, etc.). Further, alcohols and surfactants may be added to the aqueous solution of the alkali described above in appropriate amounts.

The positive-working photoresist composition of the present invention has high resolving power, high reproduction fidelity, excellent cross sectional profile of the resist image, development latitude, speed, and heat resistance. In addition, the positive-working photoresist solution of the present invention has excellent long-time storage stability.

The present invention is now illustrated in greater detail by reference to the following examples which, however, are not to be construed as limiting the present invention in any way. Unless otherwise indicated, all percents are by weight.

EXAMPLES 1, 2 AND 3

(1) Synthesis of Light-Sensitive Substance (a)

5 g of 2,3,4,3',4',5'-hexahydroxybenzophenone, 19.3 g of 1,2-naphthoquinonediazide-5-sulfonyl chloride, and 300 ml of acetone were placed in a three-necked flask and stirred to dissolve these materials uniformly. Then, a mixed solution of triethylamine/acetone (=7.3 g/50 ml) was gradually added dropwise thereto and the reaction was conducted for 4 hours at room temperature. After completion of the reaction, the contents were dropwise added to a 1% hydrochloric acid aqueous solution, and a precipitate formed was collected by filtration, washed with methanol, and dried to obtain an esterification product of 2,3,4,3',4',5'-hexahydroxybenzophenone.

(2) Synthesis of Light-Sensitive Substance (b)

5 g of 2,3,4,3',4',5'-hexahydroxybenzophenone, 24.1 g of 1,2-naphthoquinonediazide-5-sulfonyl chloride, and 300 ml of acetone were placed in a three-necked flask and stirred to dissolve these materials uniformly. Then, a mixed solution of triethylamine/acetone (=9.1 g/50 ml) was gradually added dropwise thereto. Subsequent procedures were conducted in the same manner as described in (1) to obtain an esterification product of 2,3,4,3',4',5'-hexahydroxybenzophenone.

(3) Synthesis of Light-Sensitive Substance (c)

5 g of 2,3,4,3',4',5'-hexahydroxybenzophenone, 29.0 g of 1,2-naphthoquinonediazide-5-sulfonyl chloride, and 300 ml of acetone were placed in a three-necked flask, and stirred to dissolve these materials uniformly. Then, a mixed solution of triethylamine/acetone (=10.9 g/50 ml) was gradually added thereto dropwise. Subsequent procedures were conducted in the same manner as in (1) to obtain an esterification product of 2,3,4,3',4',5'-hexahydroxybenzophenone.

(4) Synthesis of Novolak Resin 60 g of m-cresol, 40 g of p-cresol, 54.0 g of a 37% formaldehyde aqueous solution, and 0.05 g of oxalic acid were placed in a three-necked flask, and the temperature of the mixture was raised to 100° C. with stirring. The mixture was allowed to react for 10 hours. After completion of the reaction, the reaction mixture was cooled to room temperature, then the pressure was reduced to a pressure of 30 mmHg. Then, the mixture was gradually heated to 150° C. to remove water and unreacted monomer. The resulting novolak resin had a weight average molecular weight of 11,000 (calculated as polystyrene).

(5) Preparation and Evaluation of Positive Photoresist Composition 1.30 g of one of Light-Sensitive Substances (a), (b) and (c) obtained in (1), (2) and (3) and shown in the following Table 1 and 5 g of the cresol novolak resin (molecular weight=11,000) obtained in (4) were dissolved in 15 g of ethyl lactate, and filtered through a 0.2-μm microfilter to prepare a photoresist composition. This photoresist composition was coated on a silicon wafer using a spinner, and dried in a convection oven under a nitrogen atmosphere at 90° C. for 30 minutes to obtain a 1.5-μm thick resist coat. This coat was exposed using a reduction-projecting exposure apparatus, then developed for 1 minute using a 2.38% aqueous solution of tetramethylammonium hydroxide, washed with water for 30 seconds, then dried.

The thus-obtained resist pattern on the silicon wafer was observed under a scanning type electron microscope to evaluate the resist. The results thus-obtained are tabulated in Table 2 below.

Speed was defined as the reciprocal of the exposure amount necessary for reproducing a 2.0-μm mask pattern, and is shown as a relative value taking the speed of Comparative Example 1 as 1.0.

The coat-remaining ratio was presented as the ratio of the coat in the unexposed areas after development to that before development in terms of percentage.

The resolving power represents the limit resolving power for the exposure amount sufficient to reproduce 2.0-μm mask pattern.

Heat resistance was presented as the temperature at which a resist pattern formed on a silicon wafer was not deformed after baking for 30 minutes in a convection oven. The form of the resist was presented as an angle ($\theta$) made by the resist wall with the plane of the silicon wafer in the cross section of a 1.0-μm resist pattern.

As is seen from the results, all of the positive photoresists of the present invention showed excellent resolving power, resist profile, speed, and heat resistance. These positive-working photoresist solutions of the present invention formed no precipitates in the resist solution even after being left at 40° C. for 50 days.

COMPARATIVE EXAMPLES 1, 2 AND 3

1.30 g of one of Light-Sensitive Substances (a), (d) and (e) described in the following Table 1 and 5 g of cresol novolak resin used in the above-described Examples were dissolved in 15 g of ethyl Cellosolve acetate, and resists were formed and evaluated in the same manner as in Example 1. The resists thus obtained are shown in Table 2. In Comparative Examples 1, 2 and 3, precipitates were observed in the resist solutions after storage for 50 days at 40° C.

TABLE 1

| Light-Sensitive Substance | Esterification Ratio (%) |
| --- | --- |
| (a) 1,2-Naphthoquinonediazide-5-sulfonate of 2,3,4,3',4',5'-hexahydroxybenzophenone | 67 |
| (b) Same as above | 83 |
| (c) Same as above | 100 |
| (d) 1,2-Naphthoquinonediazide-5-sulfonate of 2,3,4-trihydroxybenzophenone | 83 |
| (e) 1,2-Naphthoquinonediazide-5-sulfonate of 2,3,4,4'-tetrahydroxybenzophenone | 75 |

TABLE 2

| Example No. | Light-Sensitive Substance | Relative Sensitivity | Coat-Remaining Ratio (%) | Resolving Power (μm) | Heat Resistance (°C.) | Resist Form (θ) |
| --- | --- | --- | --- | --- | --- | --- |
| Example 1 | (a) | 1.6 | 100 | 0.6 | 160 | 87 |
| Example 2 | (b) | 1.4 | 100 | 0.6 | 160 | 88 |
| Example 3 | (c) | 1.2 | 100 | 0.6 | 160 | 89 |
| Comparative Example 1 | (d) | 1.0 | 98 | 0.8 | 140 | 83 |
| Comparative Example 2 | (e) | 1.1 | 98 | 0.8 | 140 | 82 |
| Comparative Example 3 | (a) | 1.4 | 100 | 0.7 | 150 | 86 |

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition comprising:
   (A) a light-sensitive amount of an ester obtained by reaction of a 1,2-naphthoquinonediazide-4-sulfonyl compound, a 1,2-naphthoquinonediazide-5-sulfonyl compound, or a mixture thereof, with 2,3,4,3',4',5-hexahydroxybenzxophenone, and
   (B) an alkali-soluble novolak resin, wherein components (A) and (B) are dissolved in solution with ethyl lactate or methyl lactate, wherein component (A) is present in an amount of 5 to 100 parts by weight per 100 parts by weight of component (B).

2. The positive-working photoresist composition of claim 1, wherein component (A) is represented by the formula (A):

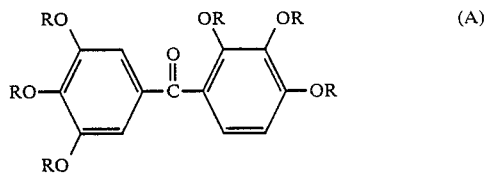

wherein the R's may be the same or different and each represents a hydrogen atom, a 1,2-naphthoquinonediazide-4-sulfonyl group or a 1,2-naphthoquinonediazide-5-sulfonyl group.

3. The positive-working photoresist composition of claim 1, wherein component (A) has an esterification ratio of not less than 40%.

4. The positive-working photoresist composition of claim 1, wherein the alkali-soluble novolak resin has a molecular weight of 1,000 to 50,000.

5. The positive-working photoresist composition of claim 1, wherein the alkali-soluble novolak resin is the acid catalyzed addition condensation product of a phenol with 0.6 to 1.0 mol of an aldehyde per mol of the phenol.

6. The positive-working photoresist composition of claim 1, wherein component (A) is present in an amount of 10 to 50 parts by weight per 100 parts by weight of component (B).

7. The positive-working photoresist composition of claim 1, wherein the solid content of the composition is from about 10 to about 50% by weight based on the total weight of the composition.

* * * * *